(12) United States Patent
Lopatinsky et al.

(10) Patent No.: US 7,071,587 B2
(45) Date of Patent: Jul. 4, 2006

(54) INTEGRATED COOLER FOR ELECTRONIC DEVICES

(75) Inventors: Edward L. Lopatinsky, San Diego, CA (US); Dan K. Shaefer, Palm Desert, CA (US); Saveliy T. Rosenfeld, San Diego, CA (US); Lev A. Fedoseyev, El Cajon, CA (US)

(73) Assignee: ROTYS Inc., San Diego, CA (US)

( * ) Notice: Subject to any disclaimer, the term of this patent is extended or adjusted under 35 U.S.C. 154(b) by 131 days.

(21) Appl. No.: 10/488,797

(22) PCT Filed: Sep. 6, 2001

(86) PCT No.: PCT/US02/28409

§ 371 (c)(1),
(2), (4) Date: Mar. 5, 2004

(87) PCT Pub. No.: WO03/023289

PCT Pub. Date: Mar. 20, 2003

(65) Prior Publication Data

US 2004/0245866 A1  Dec. 9, 2004

Related U.S. Application Data

(60) Provisional application No. 60/318,246, filed on Sep. 7, 2001.

(51) Int. Cl.
*H02K 9/00* (2006.01)
*H02K 9/06* (2006.01)
*H02K 1/22* (2006.01)
*F04B 17/00* (2006.01)

(52) U.S. Cl. .......................... 310/64; 310/62; 310/58; 310/60 R; 310/268; 310/DIG. 6; 417/356; 417/423.1; 417/423.7

(58) Field of Classification Search ................ 310/64, 310/62, 60 R, 61, 63, 58, 268, 156.32–156.37, 310/DIG. 6; 361/695, 696, 697, 694, 692, 361/700, 703; 257/712, 713; 165/80.3, 165/104.33, 121, 122; 417/356, 423.1, 423.7
See application file for complete search history.

(56) References Cited

U.S. PATENT DOCUMENTS

| 4,164,690 A | | 8/1979 | Muller et al. | |
|---|---|---|---|---|
| 4,431,048 A | * | 2/1984 | Mori et al. | .............. 165/88 |
| 5,616,974 A | | 4/1997 | Yamada | |
| 5,769,069 A | * | 6/1998 | Caffell | ............... 126/634 |

(Continued)

FOREIGN PATENT DOCUMENTS

WO    WO 01/16530 A1    3/2001

(Continued)

*Primary Examiner*—Julio Gonzalez R.

(57) ABSTRACT

An integrated cooler for electronic devices comprises a heat exchange element, a heat transferring element and a blower with an electric drive. The heat exchange element comprises a base and heat exchanging means. The electronic device directly thermally connected with the base or the heat exchanging means by the heat transferring element. The blower comprises an inlet, an outlet and a drum type impeller comprises a disk with blades mounted on an axle fixed perpendicularly to the base. The heat exchanging means located at the inlet and/or at the outlet, thus ambient air flows through the inlet, the impeller and the outlet in a series way and in the directions perpendicular to the axle, so that the blower is a crossflow type blower. The electric drive comprises a rotor and a stator. The rotor made as the impeller having circumferential arrayed magnetic means. The stator comprises circumferential arrayed coils.

25 Claims, 16 Drawing Sheets

U.S. PATENT DOCUMENTS

| | | | |
|---|---|---|---|
| 5,867,365 A * | 2/1999 | Chiou | 361/690 |
| 6,005,324 A * | 12/1999 | Kim | 310/268 |
| 6,047,765 A * | 4/2000 | Zhan | 165/80.3 |
| 6,066,910 A * | 5/2000 | Scherrer | 310/268 |
| 6,111,748 A * | 8/2000 | Bhatia | 361/695 |
| 6,166,905 A | 12/2000 | Oyamada et al. | |
| 6,227,286 B1 * | 5/2001 | Katsui | 165/80.3 |
| 6,232,696 B1 * | 5/2001 | Kim et al. | 310/156.37 |
| 6,291,912 B1 | 9/2001 | Nadir et al. | |
| 6,421,239 B1 * | 7/2002 | Huang | 361/696 |
| 6,439,299 B1 * | 8/2002 | Miyahara et al. | 165/121 |
| 6,575,717 B1 * | 6/2003 | Ozaki et al. | 417/420 |
| 6,698,505 B1 * | 3/2004 | Lopatinsky et al. | 165/122 |
| 6,778,390 B1 * | 8/2004 | Michael | 361/695 |
| 6,903,928 B1 * | 6/2005 | Lopatinsky et al. | 361/697 |

FOREIGN PATENT DOCUMENTS

WO     WO 01/43519 A1     6/2001

* cited by examiner

INTEGRATED COOLER FOR ELECTRONIC DEVICES

This application is a U.S. National Phase Application under 35 USC 371 of International Application PCT/US02/28409 filed Sep. 6, 2002 which claims the benefit of priority of U.S. Provisional Patent Application Ser. No. 60/318,246, filed Sep. 7, 2001, the entire contents of which are hereby incorporated by reference.

FIELD OF THE INVENTION

The present invention relates generally to cooling systems. More particularly, the present invention relates to cooling systems for regulating the temperature of electronic devices. The present invention is particularly, but not exclusively, useful for a cooling system for regulating the temperature of electronic components of a laptop computer.

BACKGROUND OF THE INVENTION

The regulation of the temperature due to heat generated inside the housing of an electronic device is an important consideration during the design of an electronic device. Cooling is important because if left unchecked, heat can cause electronic components to malfunction during use or lead to premature component failure. As improvements in processor size and speed occur, the amount of heat generated by the larger and faster processors also increases. Additionally, improved processors require larger power supplies and auxiliary components that generate increased amounts of heat and require improved systems for heat removal.

Another factor that aggravates the need for improved heat removal cooling systems is the trend towards making portable computing devices such as laptops, personal data assistant's (PDA'S) and handheld computing devices smaller and thinner. The trend toward smaller and thinner electronic devices having larger, faster processors renders the traditional heat removal cooling systems inadequate for several reasons. First, smaller devices having faster processors result in an increased density of heat producing electronic components leading to higher localized concentrations of heat. Also, a decreased amount of space is available for localized temperature regulating devices such as traditional heat sinks. Lastly, a decreased amount of space is available to create ventilation paths that pass by heat sources.

One such cooling device is a passive heat sink. In such a device a heat sink is formed from a material, such as aluminum, which readily conducts heat. The heat sink is usually placed on top of and in physical contact with the component.

One method of increasing the cooling capacity of these heat sinks is by including a plurality of cooling fins that are physically connected to the heat sink. These fins serve to increase the surface area of the heat sink and, thus maximize the transfer of heat from the heat sink to the surrounding atmosphere. In this manner the heat sink draws heat away from the component and transfers the heat into the surrounding air.

In order to further enhance the cooling capacity of a heat sink device an electrically powered blower (an axial fan may serve as the blower) is often mounted within or on top of the heat sink. In operation the fan forces air to move past the fins of the heat sink, thus cooling the fins by enhancing the transfer of heat from the fins into the surrounding atmosphere. As air flows by the fins, heat can be drawn from the component into the heat sink at a faster rate. The fan typically draws air into the heat sink from the top, passes the air over the fins, and exhausts the air in the vicinity of the bottom. Accordingly, the exhaust air is hotter than that of the intake air.

There are known devices of this type, for example, U.S. Pat. No. 6,196,300 "Heat sink". The device described in this US patent comprises an axial fan with hub and blades that produces a flow passing by heat exchanging channels of the heat sink. The majority of inlets to the heat exchanging channels are located just opposite the axial fan's impeller with a certain number of said channels being placed radial in relation to fan axle.

The axial fan produces a sufficiently high air pressure. However, due to the weak airflow in the area adjacent to fan axle, the conditions for cooling the central part of the heat sink located underneath the hub are unfavorable. In this case non-uniform cooling of the heat sink and electronic component will take place allowing for bad conditions for the heat exchange process.

Centrifugal blowers are used more rarely in cooling device designs for the purpose of producing airflow.

Specifically, U.S. Pat. No. 5,838,066 "Miniaturized cooling fan type heat sink for semiconductor device" offers a design employing a centrifugal blower that is installed to the side of the heat sink. In one particular embodiment of this invention the cooling airflow passes by rectilinear means through the heat exchanging channels of the heat sink.

However, placement of a centrifugal blower to the side of the heat sink increases the devices size and reduces its effectiveness. This is because the location of the centrifugal blower leads to insufficient coordination between the direction of channel inlets and direction of airflow supplied from the blower. The loss in airflow energy results in the reduction of airflow speed in the heat exchanging channels and the reduction of heat exchange efficiency. A portion of energy is also expended as friction against the casing that encloses the blower.

An invention described in the patent of Japan No. 8-195456 entitled "Cooler for electronic apparatus". This device comprises a centrifugal fan enclosed in the casing and installed above the heat exchanging channels that are made divergent. Another heat sink surface is made so that the possibility of thermal contact with an electronic device is provided. The inlet of the centrifugal fan faces the heat sink. The fan produces an airflow that passes by the heat exchanging channels and then gets drawn into the inlet of the centrifugal fan. Since this centrifugal fan operates by drawing air in through the heat sink, there is an area in the central part of the heat sink that receives poor air circulation. Adding to this problem, the airflow first passes through the elongated heat exchanging channels gathering heat along the way from the channels surfaces. As the air approaches the central part of the heat sink its cooling ability is decreased due to the reduced temperature differential between the preheated channel air temperature and the surface temperature at the center of the heat sink. This results in inefficient cooling of the heat sink's central surface area and uneven cooling of the heat sink in general. This is the area where the electrical component is transferring the most heat to the heat sink and where the greater differential between the two is most important. To help overshadow this problem, one has to increase the fans power resulting in an increased airflow but not solving the initial problem. In addition to the heat dissipation problems, the device is considerably large due to the centrifugal fans placement above the heat sink. An electric drive is yet placed above the centrifugal fan increasing the coolers overall size even more.

Additionally, traditional fan assemblies are less effective in removing heat when used in smaller, thinner devices.

It is known cooler for electronic devices that uses cross flow fans (see U.S. Pat. No. 6,227,286 FIGS. 15A–15C and 40A–40C). Using this type fan gives the possibility to suck and discharge air at the sides of the fan; therefore the thickness of the apparatus can be reduced. The design described in this invention has pour efficiency because there is a hub inside the fan impeller where the fan motor is located.

It is also known another cross flow cooling device for semiconductor components that uses cross flow fans (see U.S. Pat. No. 6,047,765). This device needs an electric motor mounted at a shaft outside of an impeller, therefore increasing dimensions of the cooling device.

Thus, it would be generally desirable to provide an apparatus that overcomes these problems associated with fan assisted heat sink devices.

SUMMARY OF THE INVENTION

The objectives of the present invention are to realize an integrated combination heat sink-blower-electric drive having relatively small dimensions at higher thermal efficiency, higher reliability and suitable design useful for especially small electronic components.

In order to achieve these objectives, according to the present invention, an integrated cooler for electronic devices comprises: at least one heat exchange element, at least one heat transferring element, a blower and an electric drive.

Said at least one heat exchange element comprises a heat spreading base and at least one heat exchanging means made on a surface of the base, said heat spreading base provides thermal contact with said at least one heat transferring element.

Said blower comprises a blower inlet and a blower outlet, which are directly connected to ambient air, a drum type radial impeller that is mounted on an axle and comprises at least one impeller disk and blades attached to said at least one impeller disk; The blower is positioned on the heat exchange element so that the heat exchanging means are located at the blower outlet and/or at the blower inlet.

Said electric drive comprises a rotor and at least one stator. The rotor made as drum type radial impeller and has circumferential arrayed magnetic means magnetized in the direction parallel to said axle. The stator comprises circumferential arrayed coils etched on circuit board metal layers and numbers of the coils is divisible in respect to numbers of the magnetic means; the coils are spaced axially from the magnetic means of the impeller.

The heat exchanging means are pins or fins, or pins and fins. The heat transferring element may be heat-pipes, an electronic device or made from high heat-conducting material.

The heat exchanging means are formed by rows of profiled elements and said rows of profiled elements together with inner surfaces of the blower inlet and the blower outlet form heat exchanging channels. These heat exchanging channels may be made spiral-like and bent in the direction of the drum type radial impeller rotation. Inlets of the heat exchanging channels located at the blower outlet are oriented in the output direction of the ambient air flow produced by the drum type radial impeller. The heat exchanging channels may be made of constant width.

The directions of the ambient air flow at the blower inlet and the blower outlet are at a plane perpendicularly to the axle, so that said blower is a cross flow type blower. Further, the cross flow type blower comprises fixed guide vanes located inside the drum type radial impeller.

The magnetic means may be as at least part of the blades or at least part of every said blade.

According to the first embodiment the integrated cooler for electronic devices comprises at least one heat transferring element located between two heat exchange elements connected together by the heat spreading bases and the heat exchanging means of each said heat exchanging element covered by the stators. The drum type radial impeller is located between said stators.

Further, the rotor may comprise at least one magnetized disk serving as the magnetic means, said magnetized disk is flush-mounted with the impeller disk.

According to modification of the first embodiment the rotor comprises two magnetized disks and each magnetized disk is mounted on the axle and has a circumferential array of radially extending magnetized poles, said magnetized poles of one magnetized disk are spaced axially from the magnetized poles of other magnetized disk to form a gap where the stator is located, and said magnetized poles of one magnetized disk are magnetically opposite to the magnetized poles of other magnetized disk, such that the flux lines of the magnetized N poles of one magnetized disk extends to S poles of other magnetized disk in the shortest axial flux dimension across said gap. Additionally, the rotor may comprise cylindrical or polygonal magnets magnetized in axial direction and placed coaxially to the axle between said adjacent magnetized disks. Further, the impeller may comprise two impeller disks, wherein each impeller disk has one side attached to the blades, while the other side is attached with each said flush-mounted magnetized disk. The coils are at least partially positioned within the gap between the magnetized disks.

The coils are plated with a ferromagnetic coating material that may be nickel. The circuit board metal layers are copper layers that form the coils.

Further, the stator comprises a controlling device of a type H-bridge drive, and a single layer of coils located on each side of the circuit board. Each said layer comprises several pairs of coils and each pair is made as a spiral that extends from the center of a start coil to a center of an end coil with the same turn direction of the spiral in relation to each coils center; said layers of coils are the same in transparent view and shifted angularly in such a way that the center of the start coils from one side of the board are electrically connected through the circuit board by internal via's, which are copper plated holes, with the center of the end coils on the other side of the board; the circuit of said one layer of coils is interrupted (broken) for providing power leads to the said controlling device.

According to the second embodiment the fins are located at the blower inlet, fixed around and directly thermally connected with the heat-pipe. The blower is the cross flow type blower.

DETAILED DESCRIPTION OF PREFERRED EMBODIMENTS

Figure 1:
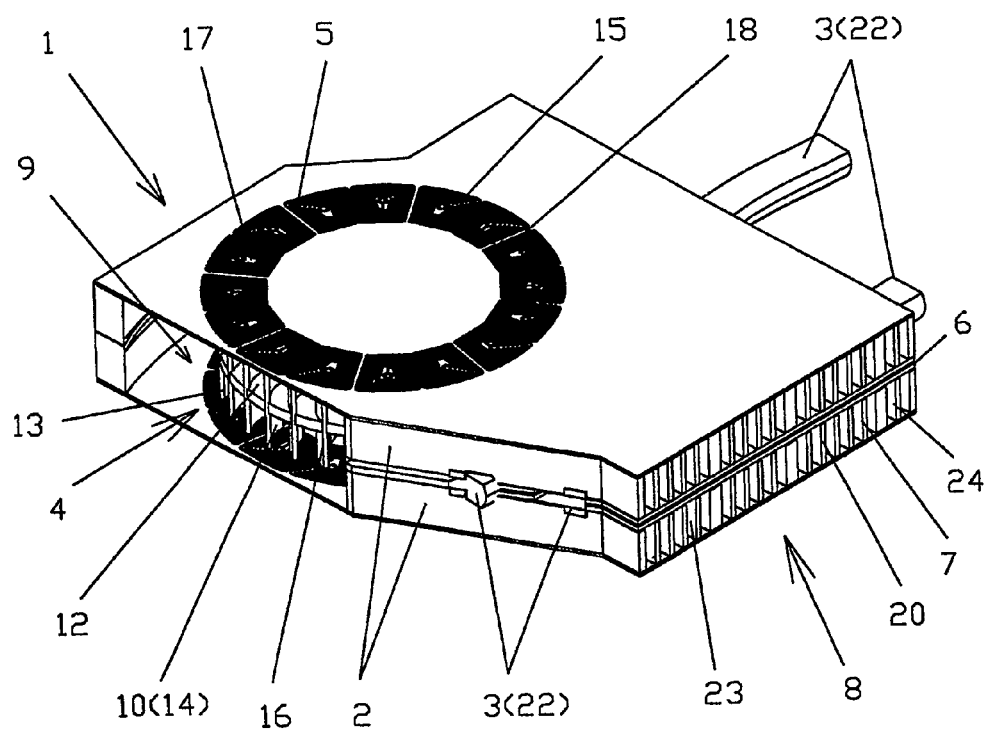
FIG. 1 is a perspective view showing a first embodiment of present invention wherein a blower is a cross flow type blower and electric drive comprises two stators.

Preferred embodiments of the present invention will be described in detail below with reference to the accompanying drawings.

FIGS. 1–8 show the first embodiment of the present invention.

The integrated cooler 1 for electronic devices comprises at least one heat exchange element 2, at least one heat transferring element 3, a blower 4 and an electric drive 5. The heat exchange element 2 includes a heat spreading base 6 and heat exchanging means 7 made on a surface of the base 6. The heat spreading base 6 provides thermal contact with the heat transferring elements 3. FIGS. 1–4 and 8 illustrate two heat transferring elements 3. The heat transferring element 3 may be an electronic device 21 (see FIG. 8), a heat-pipe 22 or another heat transferring element 3 made from a high heat-conducting material. The heat exchanging means 7 are pins 19 and/or fins 20.

The blower 4 comprises a blower inlet 8 and a blower outlet 9, which are directly connected to ambient air, so that the integrated cooler for electronic devices 1 becomes a hydraulically sealed unit. It is possible to use any other cooling gas, not only ambient air. The blower 4 comprises a drum type radial impeller 10 that is mounted on an axle 11 and comprises at least one impeller disk 12 (FIG. 8) or two impeller disks 12 (FIGS. 1, 2 and 4) and blades 13 attached to the impeller disk 12. The blower 4 is positioned on the heat exchange element 2 so that the heat exchanging means 7 are located at the blower outlet 9 and/or at the blower inlet 8. In this embodiment (see FIGS. 3 and 8A) pins 19 and fins 20 are located at the blower inlet 8 and pins 19 are located at the blower outlet 9.

The ambient air flows at the blower inlet 8 and the blower outlet 9 at a plane perpendicularly to the axle 11, so that the blower 4 is a cross flow type blower 26. The cross flow type blower 26 may include fixed guide vanes 27 (straightners) located inside the drum type radial impeller 10. The straightners 27 improve the cross flow type blower 26 performance. The cross flow type blower 26 is positioned so that the cooling gas (ambient air) flows through the heat exchanging means 7 at the blower inlet 8, the drum type radial impellers 10 with the straightners 27 and heat exchanging means 7 at the blower outlet 9 in a series way.

During cooling, gas flows by heat exchanging means 7 and a heat transfer process takes place. Heat from an electronic device (heat source) is transferred by the heat transferring elements 3 to the heat exchange element 2 and further transported by the heat spreading base 6 to the heat exchanging means 7 and dissipated to the ambient air. This results in cooling of the heat exchange element 2, the heat spreading base 6 and the heat exchanging means 7, that are in thermal contact with the heat transferring elements 3. The overall result is efficient cooling of the electronic device or heat source.

FIGS. 1–4 illustrate the cross flow type blower 26 comprises two impellers disks 12 with blades 13 perpendicular to the heat spreading base 6. The heat exchanging means 7 may be formed by rows of profiled elements 23 (fins 20). The rows of profiled elements 23 together with inner surfaces of the blower inlet 8 and the blower outlet 9 form heat exchanging channels 24. The heat exchanging channels 24 are made spiral-like and bent in the direction of the drum type radial impeller rotation. The inlets of the heat exchanging channels 24 located at the blower outlet 9 are oriented in the direction of propagation of an output of the ambient air flow produced by the drum type radial impeller 10. The heat exchanging channels 24 are made of constant width.

The integrated cooler for electronic devices 1 (see FIG. 4) comprises the heat transferring elements 3 located between two heat exchange elements 2 connected together by the heat spreading base 6 and the heat exchanging means 7 of each of the heat exchange element 2 covered by the stators 15. The drum type radial impeller 10 located between the stators 15.

The integrated cooler for electronic devices 1 (see FIGS. 8, 8A) comprises one heat exchange element 2, one heat transferring element, a blower and an electric drive. The heat exchange element 2 includes a heat spreading base 6 and heat exchanging means 7 made on a surface of the base 6. The heat exchanging means 7 are pins 19 or fins 20. The heat transferring element is an electronic device 21. The blower is a cross flow type blower with the drum type radial impeller 10. Directions of the ambient air flows at the blower inlet 8 and the blower outlet 9 are at a plane perpendicular to the axle 11. The fins 20 are located at the blower inlet 8 and the pins 19 are located at the blower outlet 9.

Figure 2:
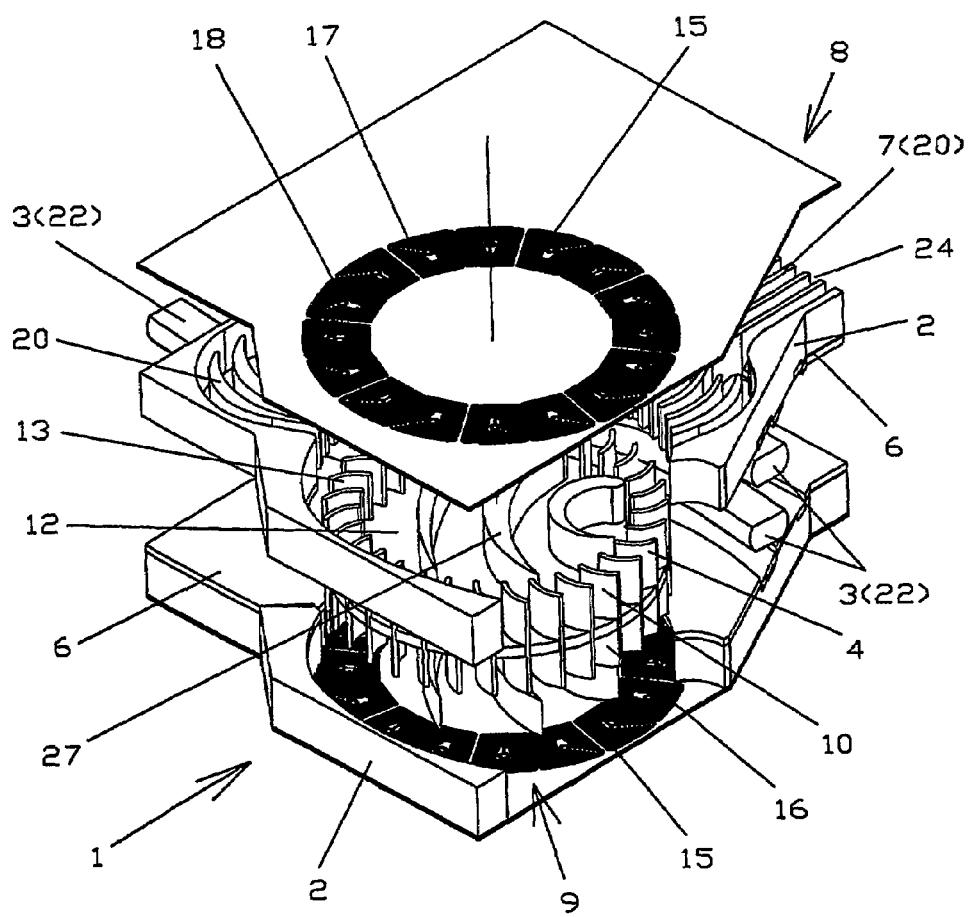
FIG. 2 is an exploded perspective view showing the first embodiment of present invention when a blower is a cross flow type blower and electric drive comprises two stators.
Figure 3:
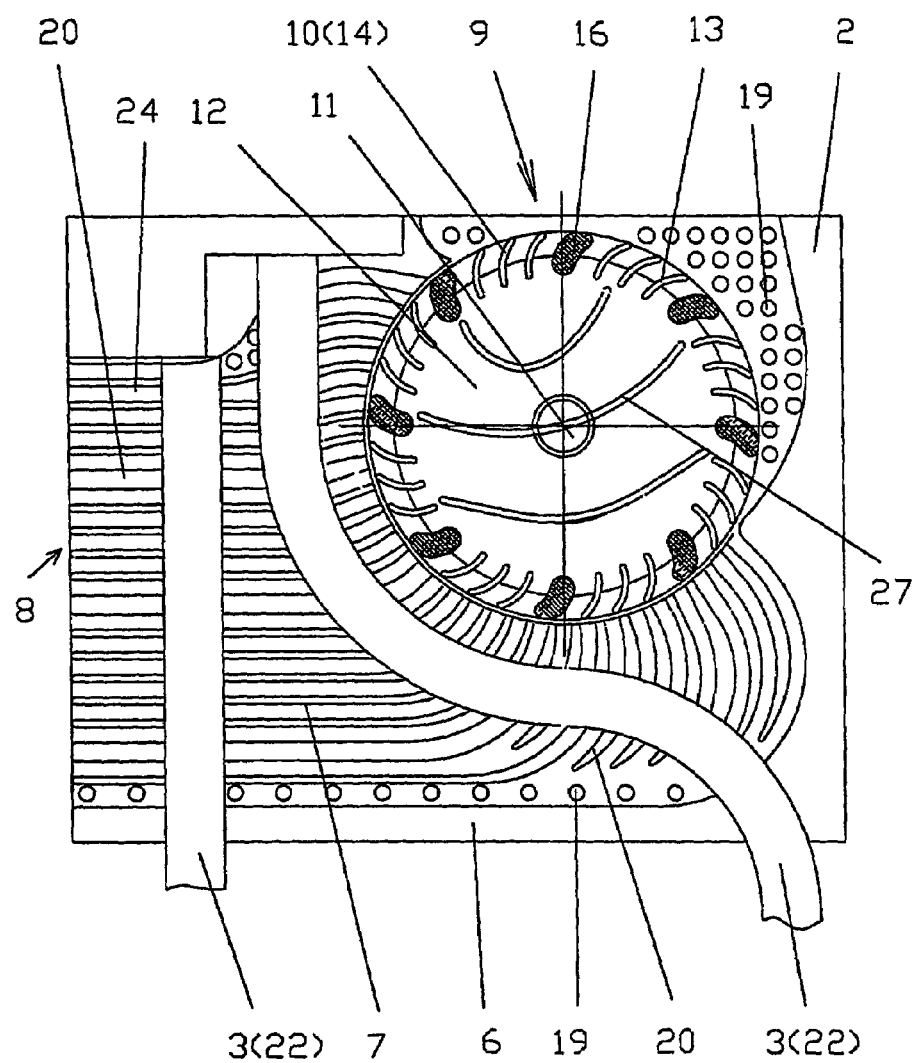
FIG. 3 is a sectional view in a plane perpendicular to the axle showing the first embodiment of present invention when a blower is a cross flow type blower and electric drive comprises two stators.
Figure 4:
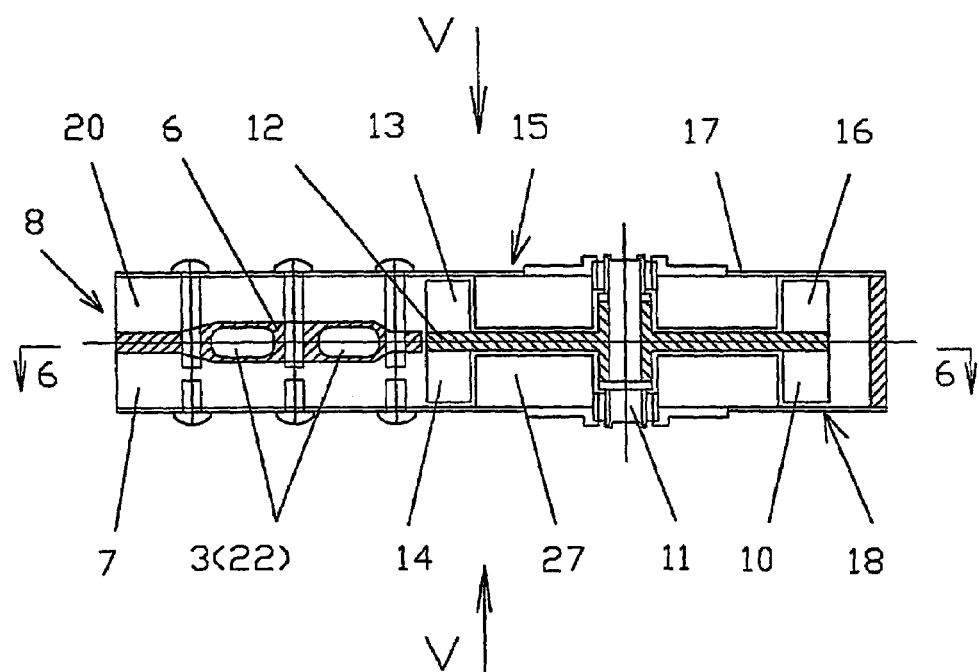
FIG. 4 is a sectional view along to the axle showing the first embodiment of present invention when a blower is a cross flow type blower and electric drive comprises two stators.
Figure 5:
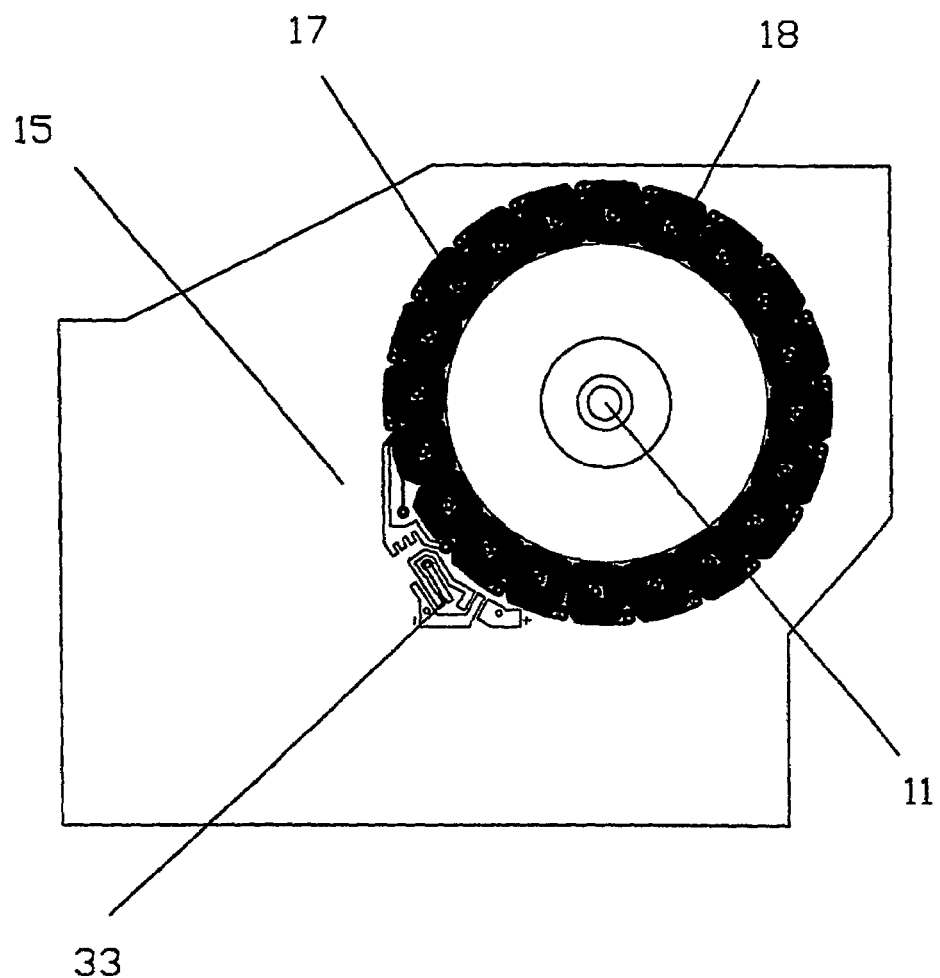
FIG. 5 is a view along arrows V of FIG. 4.
Figure 6:
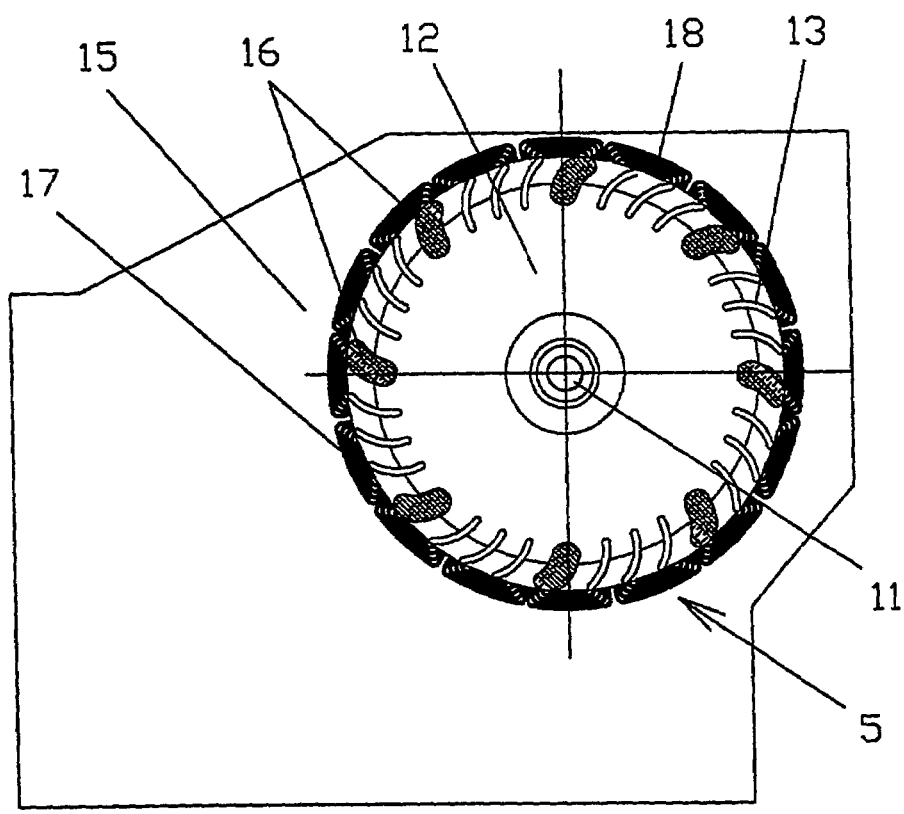
FIG. 6 is a sectional view along lines 6—6 FIG. 4.
Figure 8:
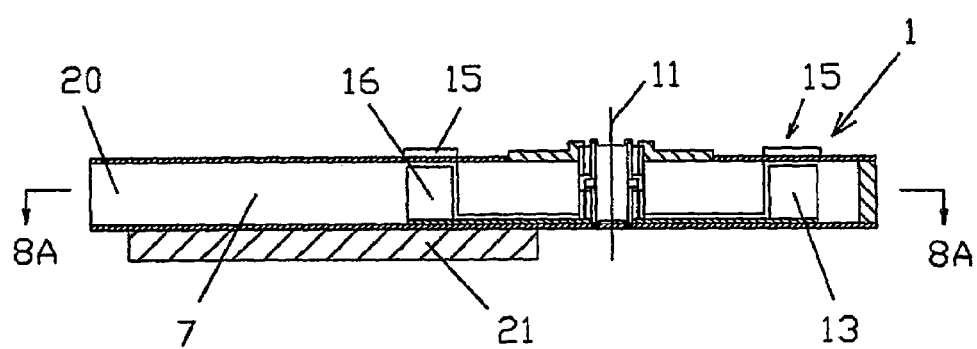
FIG. 8 is a sectional view along to the axle showing the first embodiment of present invention in rectangle form when a blower is a cross flow type blower, electric drive comprises one stator and heat transferring element is an electronic device.
Figure 8A:
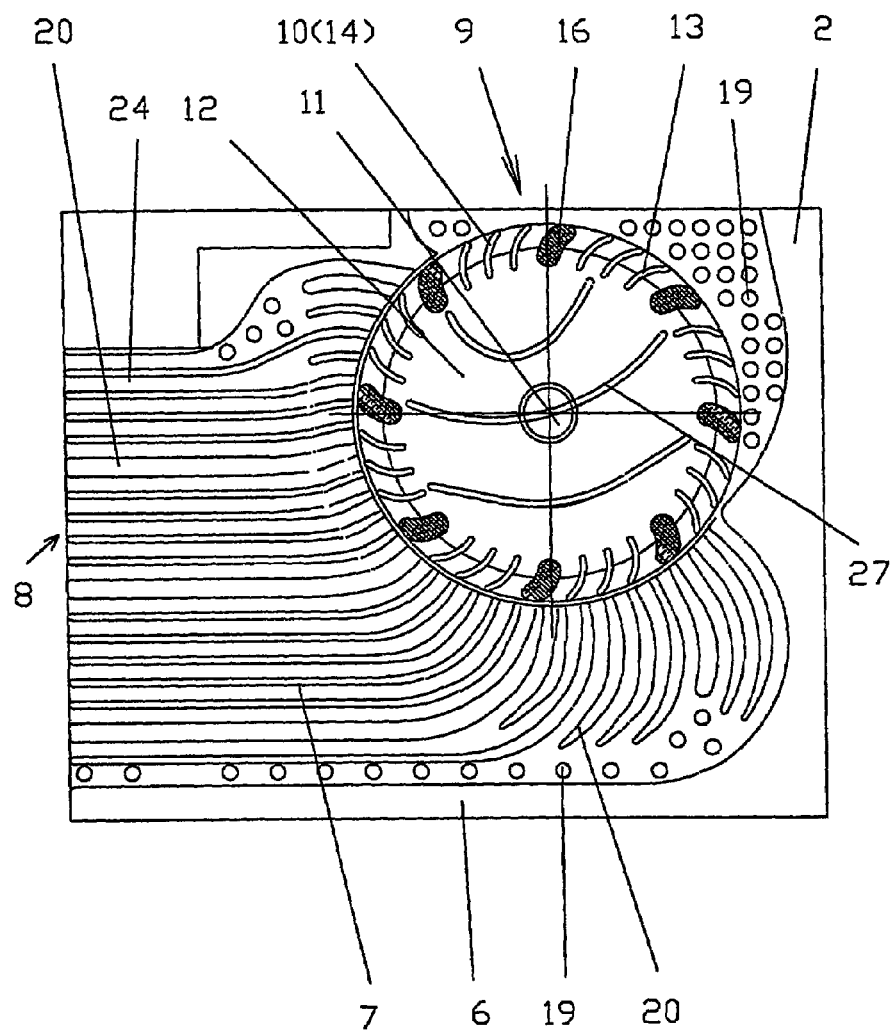
FIG. 8A is a plane view along lines 8A—8A of FIG. 8.

The electric drive comprises a rotor 14 and at least one stator 15 (FIG. 8). FIGS. 1, 2 and 4 illustrate two stators 15 covering two heat exchange elements 2 from the upper and bottom sides. The rotor 14 made as drum type radial impeller 10 having circumferential arrayed magnetic means 16 magnetized in the direction parallel to the axle 11. It is possible that the magnetic means 16 are at least part of the blades 13 (FIGS. 3, 6, and 8A) or at least part of every said blade 13 (not shown on the drawings).

The every one of the stators 15 has the same design as a printed circuit board (see FIG. 5 that is a view along arrows V of FIG. 4) and comprises circumferential arrayed coils 17 etched on circuit board metal layers 18. Numbers of said coils 17 is divisible in respect to numbers of the magnetic means 16. The coils 17 are spaced axially from the magnetic means 16 of the impeller 10. The stators 15 in detail will be describe latter.

Figure 9:
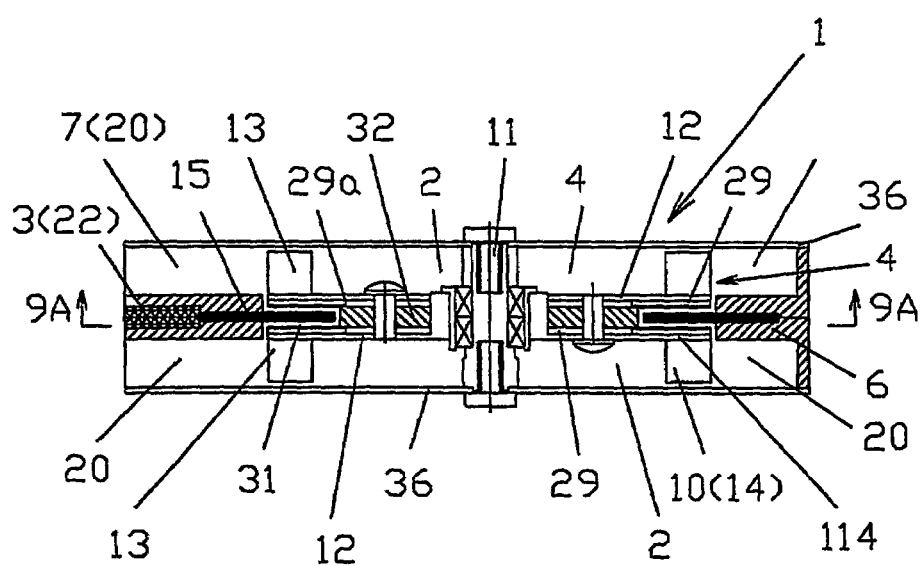
FIG. 9 is a sectional view along to the axle showing the first embodiment of present invention when a blower is a cross flow type blower with different type electric drive comprises one stator.
Figure 9A:
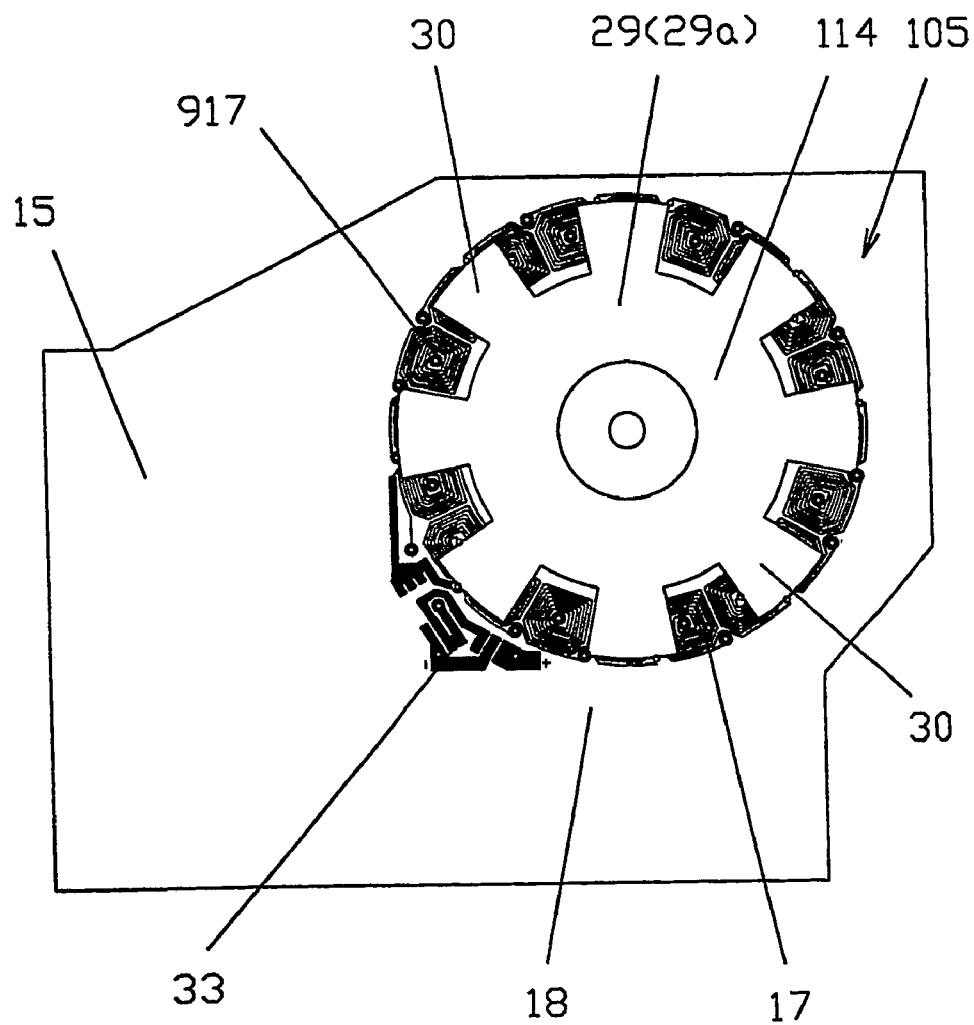
FIG. 9A is a plane view along lines 9A—9A of FIG. 9.

FIGS. 9 and 9A illustrate a modification of the first embodiment of present invention when the blower 4 is the cross flow type blower 26 with different type electric drive 5 comprises one stator 15. FIG. 9A is a plane view along lines 9A–9A of FIG. 9. This modification differs from the first embodiment only in that the electric drive 5 is a different flat type electric drive.

Other components are the same as in the first embodiment. Therefore the components the same as in the first embodiment are denoted with the same reference numerals.

The integrated cooler 1 for electronic devices (FIG. 9) comprises two heat exchange elements 2, at least one heat transferring element 3, a blower 4 and an electric drive 105. The heat exchange element 2 includes a heat spreading base 6 and heat exchanging means 7 made on a surface of the base 6. The heat spreading base 6 provides thermal contact with the heat transferring elements 3. The blower 4 comprises drum type radial impeller 10 that has two impeller disks 12. Each said impeller disk 12 from one side attached with the blades 13. The heat exchange elements 2 are covered from upper and bottom sides with covering plates 36. The direction of the ambient air flows at the blower inlet 8 and the blower outlet 9 is at a plane perpendicularly to the axle 11, so that the blower 4 is a cross flow type blower. The cross flow type blower may include fixed guide vanes (straightners, not shown in the drawings) located inside the drum type radial impeller 10. The straightners improve the cross flow type blower performance. The cross flow type blower is positioned so that the cooling gas (ambient air) flows through the heat exchanging means 7 at the blower inlet, the drum type radial impellers 10 with the straightners and the heat exchanging means 7 at the blower outlet in a series way cooling the heat exchange element 2, the heat spreading base 6 and the heat exchanging means 7, that are in thermal contact with the heat transferring elements 3 that is the heat-pipe 22.

The electric drive 105 (FIGS. 9 and 9A) comprises a rotor 114, a stator 15 and a controller device 33. The rotor 114 is connected with blower 4.

The rotor 114 comprises at least two magnetized disks 29 and 29a having circumferential arrayed like of radially extending magnetized poles 30 and is mounted perpendicularly to the axis of rotation. The magnetized poles 30 of one of the magnetized disk 29 are magnetized in opposite polarity to the magnetized poles 30 of the magnetized disk 29a and are spaced axially from the magnetized poles 30 of other magnetized disk 29 to form a gap 31 where the stator 15 is located. The magnetized poles 30 of one magnetized disk 29 are magnetically opposite to the radially extending magnetized poles 30 of other magnetized disk 29a such that the flux lines of the magnetized N poles of one magnetized disk 29 extends to S poles of other magnetized disk 29a in the shortest axial flux dimension across the gap 31. A cylindrical or polygonal magnet 32 may be placed between the two magnetized disks 29 and 29a. The impeller 10 comprises two impeller disks 12. Each said impeller disks 12 from one side attached with the blades 13, while other side of each impeller disks 12 attached with each of the flush-mounted magnetized disks 29 and 29a.

The stator 15 comprises circumferential arrayed coils 17, etched on circuit board metal layers 18, axis of the coils 17 are parallel to the axis of rotation. The coils 17 at least partially mounted at the gap 31. The electric motor drive 105 in this embodiment is substantially the same (without central hole) as was described in U.S. patent application Ser. No. 09/621,104 for ELECTRIC DRIVE OPTIONS, for the same Assignee, which is hereby incorporated by this reference for all that disclosed therein.

Each of the magnetized disks 29 and 29a of the magnetic rotor 114 is placed on the flat surface of the everyone of the two shrouds of the cross flow type blower 26 and connected with them.

The electronic controlling device 33 (FIGS. 5, 7 and 9A) for commutating the electric circuits of the stators 15 of the electric drive 5 is a Full Bridge Drive or a Two Phase-Single Ended Drive, for example Fairchild's type NDS8858H.

There are many versions of electronic controlling device 33 with different protection schemes available, however they all perform essentially the same control function. The Full Bridge Drive has a few advantages over the Single Ended Drive as can be seen in the following comparison table.

| Items for Comparison | Full Bridge Drive | Two Phase Single End Drive |
|---|---|---|
| Stator Boards coil resistance seen by Motor Controller | Equals the sum of all individual stator coils | Equals ½ the sum of all individual stator coils |
| Motor Magnetic Drive Operation | Push and Pull | Either Push or Pull |
| Motor efficiency | More efficient than Two Phase Single End Drive | Less efficient than Full Bridge Drive |
| Duty Cycle on Stator Board Coils | 100% | 50% |
| Electrical Attachment Points to Each Stator Board | 2 | 3 |
| Stator Board Construction | Requires 1 VIA for each Stator Coil | Requires 2 VIA'S for each stator Coil |

Using the Two Phase-Single Ended Drive as the controlling device 33 requires a differently designed stator 15 of the electric drive 5. Coils 17 of the stator 15 (FIGS. 5 and 7) are arranged in a circular pattern, in a plane perpendicular to an axis of rotation of the rotor 14, symmetrically located around the axle 11 that coincides with the axis of rotation. Half of one of said coils 17 (see FIGS. 7A and 7B) aligns symmetrically with the internal via 34 (a via is a copper plated through hole on the printed circuit board which has two or more layers of copper; it servers as a means of electrically connecting pads or traces of different layers together on the circuit board) connecting the other half coils 17 on the opposite side of on the circuits boards while maintaining the same turn directions. This single coil 17 is then series connected with the adjacent coils 17, correspondingly, in a manner to yield the opposite magnetic polarity. All coils 17 on the circuit boards form a continuous series connection of coils 17 with every adjacent coil 17, correspondingly, having the same turn direction.

Figure 7:
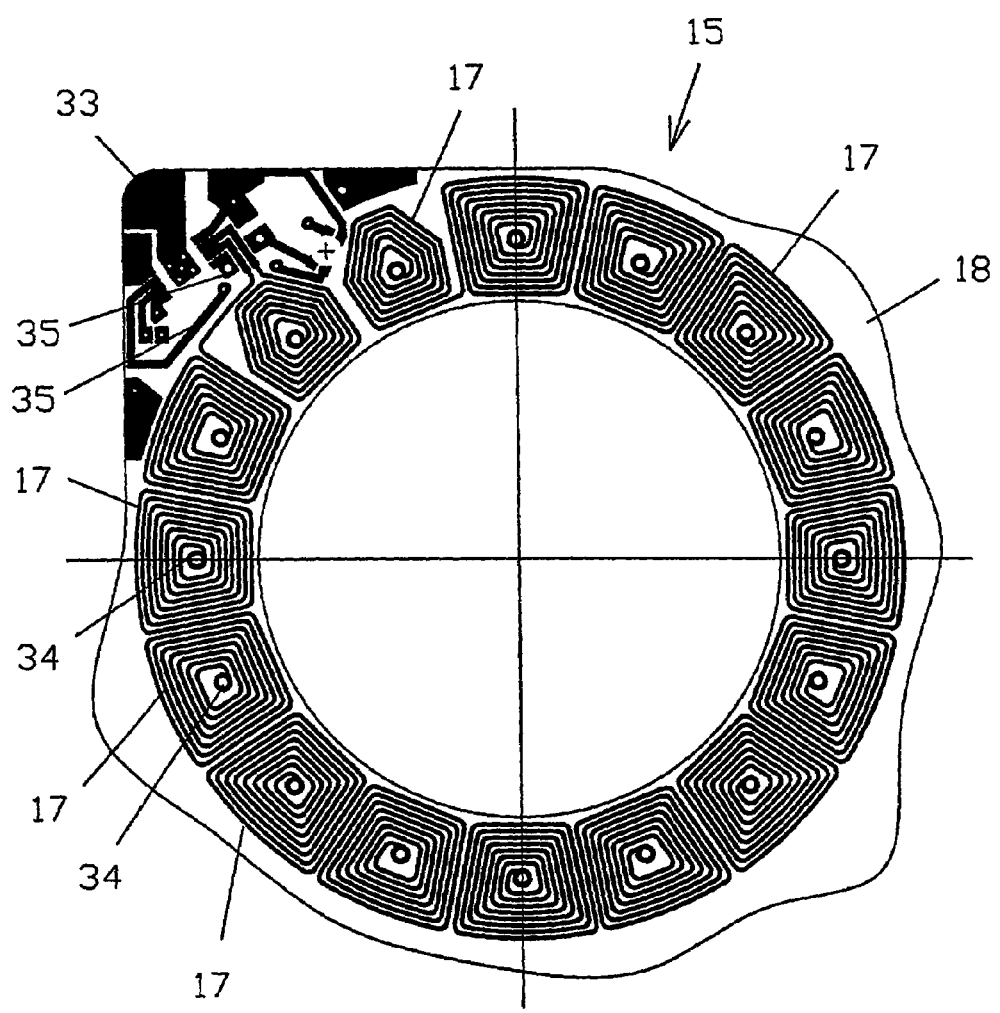
FIG. 7 is a plane view of the stator with the coils (for simplicity other parts are removed)

Each adjacent coil 17 has the opposite magnetic polarity at any one point in time. FIG. 7 illustrates an enlarge view of a front side of the stator 15 circuit board that contains coils 17 etched from metal, usually copper, on a circuit board substrate and located around the circumference of the stator 15. In FIG. 7 one of the coils 17 is interrupted (broken) for providing power leads 35 to the controlling device 33 placed on one of the stators 15. The two power leads 35 from each of the circuit board can be connected parallel or series to one another.

Figure 7A:
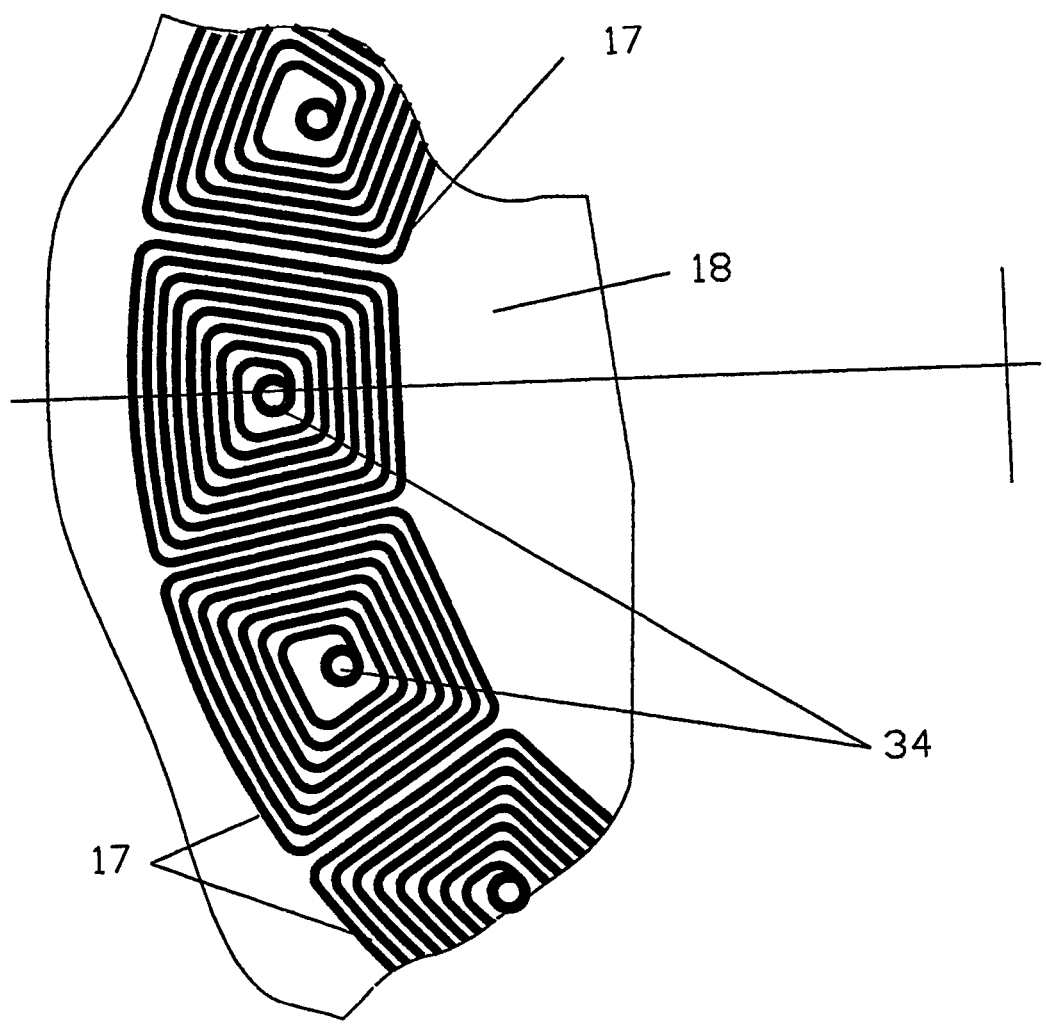
FIG. 7A is an enlarge section of the front and FIG. 7B is an enlarge section of the back (transparent) of the stator, correspondingly to FIG. 7.
Figure 7B:
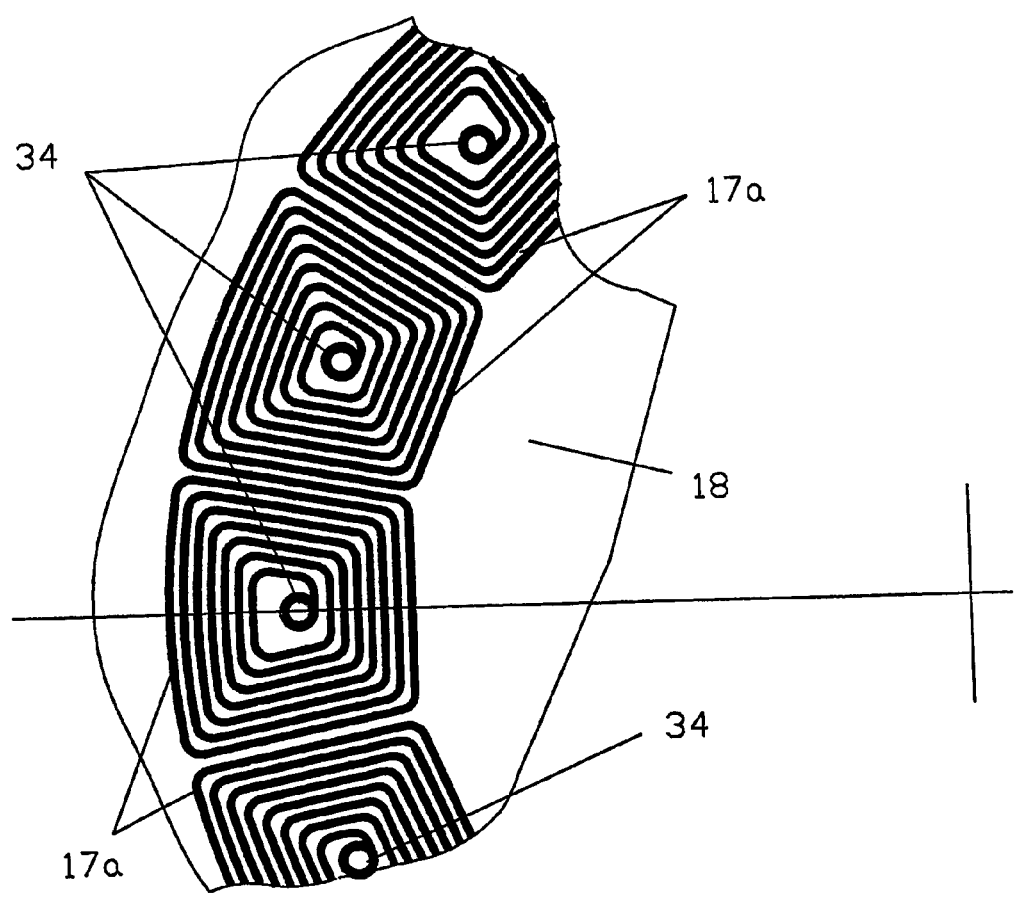

FIG. 7A illustrates an enlarge section of the front side and FIG. 7B illustrates an enlarge section of the backside (transparent) of the stator 15 circuit board on FIG. 7. A set of coils 17 and 17a are formed on each side of the circuit board. Each of these sets comprises several pairs of coils and each pair made as a spiral. In FIG. 7A the spiral extends from the center of the start coils to the center of the end coil, correspondingly, with the same turn direction of the spiral in relation to the both centers. Both layers of coils 17 and 17a are the same in the transparent view and shifted angularly in such a way that the center of the start coil or coils winding from one side of the stator circuit board is electrically connected through circuit board by internal via's 34, which are copper plated holes, with the center of the other side of the circuit board, correspondingly. Coil 17a is connected in the same fashion as coil 17, correspondingly, on the front side of the circuit board. All coils 17 and 17a around the circuit board are interconnected in this fashion creating a continuous series of coils 17. These coils 17 can be nickel gold plated which allows the magnetic means 16 on the rotor 14 and magnetized poles 30 to align with them for proper startups Nickel is ferromagnetic at temperatures below 627 degrees Kelvin).

The series connection is broken between two of the adjacent coils 17, on each on the stator 15 for electrical leads attachment 35. The two leads 35 from each of the on the stator 15 can be connected in parallel to each other or series. The connections must be phased to generate proper magnetic fields on the stator 15 relative to the rotor 14. The face of each of the stator 15 facing the rotor 14 is polarized such that the coils 17 aligning directly across each magnetized pole 30 has opposite polarities from each other at any one point in time. If connected in series, the remaining lead from each of the stator 15 will be attached to the Full Bridge Motor Driver. If connected in parallel, each of the two connected leads will be attached to the Full Bridge Motor Driver (the controlling device 33). Monitoring of a rotor 14 position for commutation of the electric drive 5 are accomplished by means of a Hall device sensing only a position of the rotor 14 of the electric drive 5.

Figure 10:
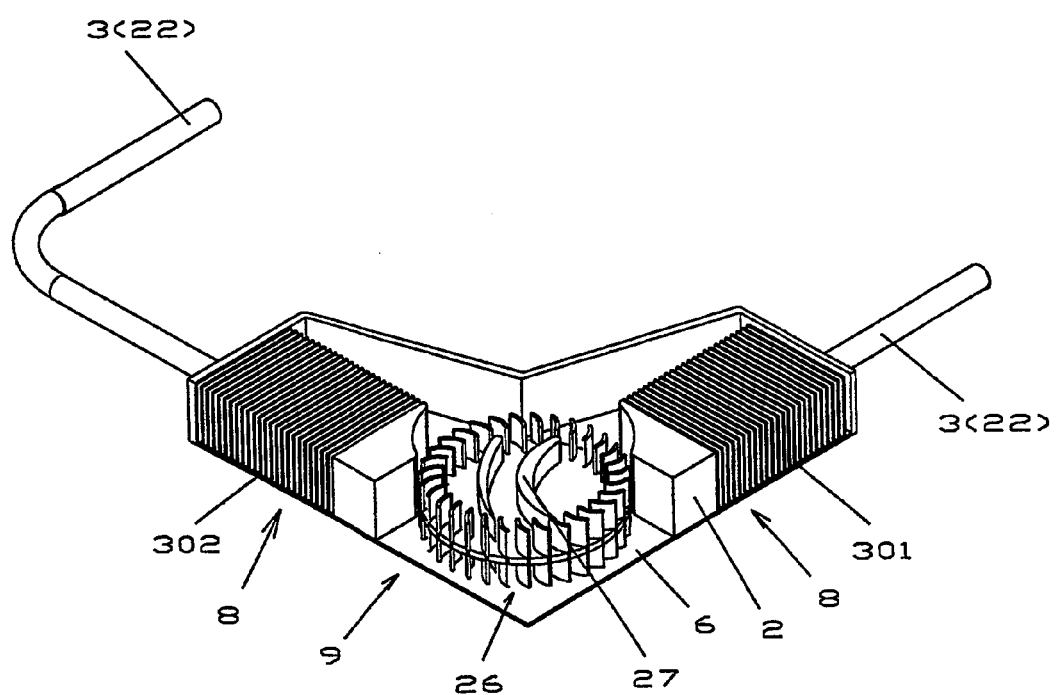
FIG. 10 is a perspective view showing the second embodiment of the present invention.
Figure 11:
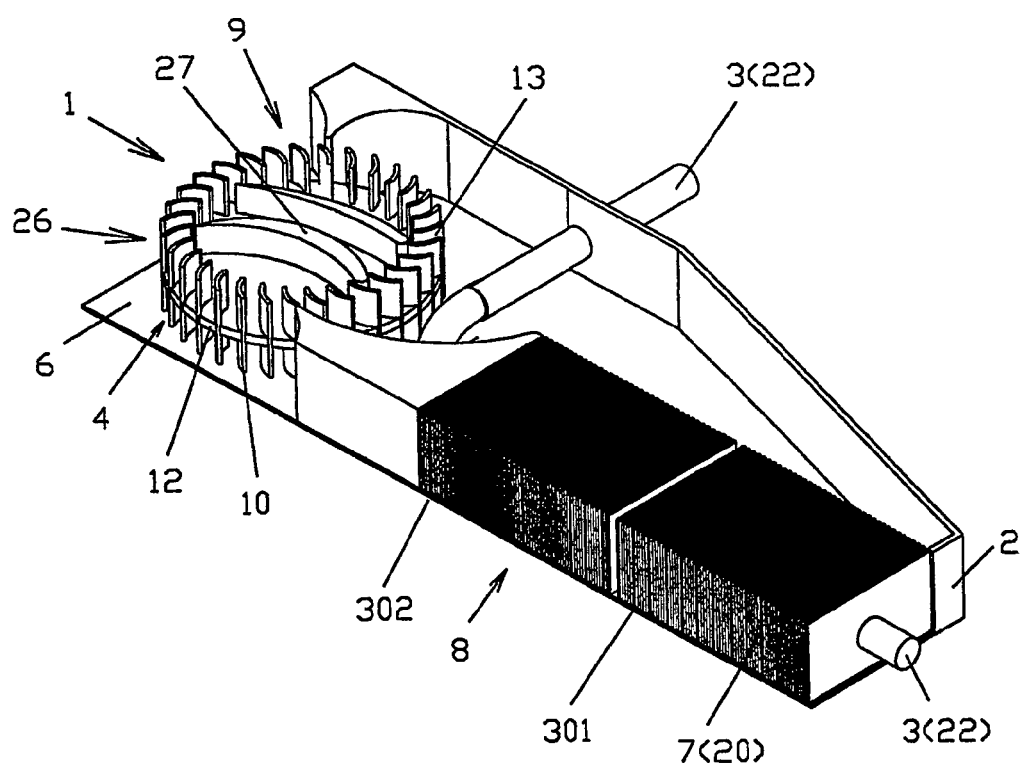
FIG. 11 is a perspective view showing a design variant of the second embodiment of the present invention.

FIGS. 10 and 11 show a second embodiment of the present invention.

The second embodiment differs from the first embodiment only in that the blower inlet 8 and blower outlet 9 have a different design.

Other components are the same as in the first embodiment. Therefore the components the same as in the first embodiment are denoted with the same reference numerals, for which description is partly omitted.

The integrated cooler 1 for electronic devices comprises at least one heat exchange element 2, at least one heat transferring element 3, a blower and an electric drive 5 (not shown for simplicity). The heat exchange element 2 includes a heat spreading base 6 and heat exchanging means 7 made on a surface of the base 6. The heat spreading base 6 provides thermal contact with the heat transferring elements 3. The heat transferring element 3 is a heat-pipe 22. The heat exchanging means 7 are fins 20 that covered from upper side with covering plates (not shown in FIGS. 10 and 11).

The blower comprises a blower inlet 8 and a blower outlet 9, which are directly connected to ambient air, so that the integrated cooler for electronic devices 1 becomes a hydraulically sealed unit. The blower comprises a drum type radial impeller 10 that is mounted on an axle and comprises impeller disk 12 and blades 13 attached to the impeller disk 12 from both sides. The blower 4 is positioned on the heat exchange element 2 so that the heat exchanging means 7 are located at the blower inlet 8. The fins 20 are located at the blower inlet 8, fixed around and directly thermally connected with the heat-pipe 22 to form two heat exchange sections 301 and 302. These heat exchange section 301 and 302 may be located adjacent each other (see FIG. 10) or in the different parts of the blower inlet 8 (see FIG. 11).

The directions of the ambient air flows at the blower inlet 8 and the blower outlet 9 is at a plane perpendicularly to the axle (not shown in FIGS. 10 and 11), so that the blower 4 is a cross flow type blower 26. The cross flow type blower may include fixed guide vanes 27 (straightners) located inside the drum type radial impeller 10. The straightners 27 improve the cross flow type blower 26 performance. The cross flow type blower 26 is positioned so that the cooling gas (ambient air) flows through the heat exchanging means 7 forming two heat exchange section 301 and 302 at the blower inlet 8, the drum type radial impellers 10 with the straightners 27 and the blower outlet 9 in a series way cooling the heat exchange element 2, the heat spreading base 6 and the heat exchanging means 7, that are in thermal contact with at least one heat-pipe 22. The cross flow type blower 26 comprises the drum type radial impellers 10 perpendicular to the heat spreading base 6.

Figure 12:
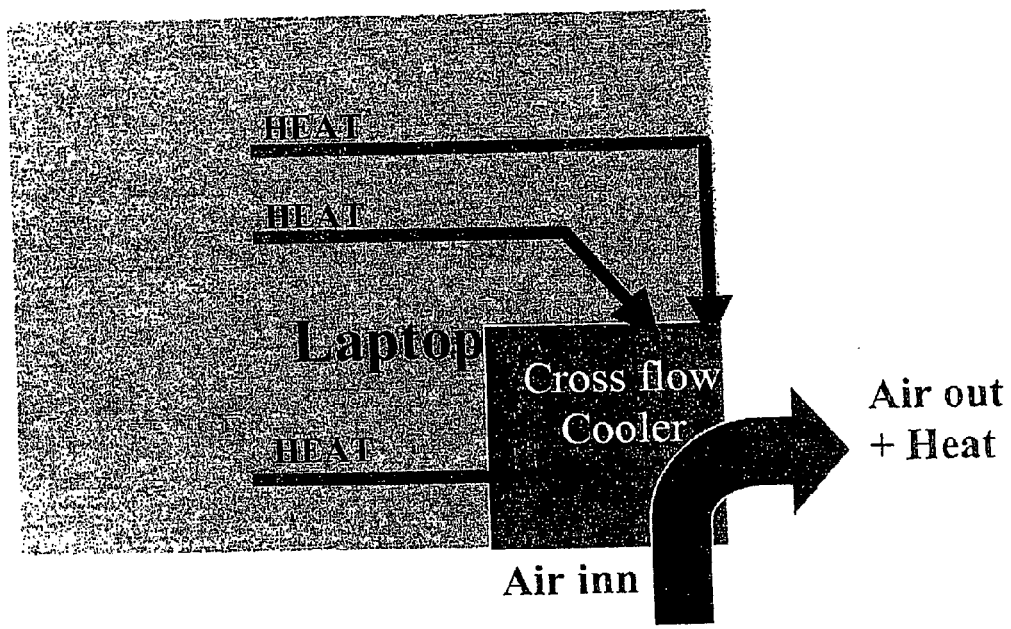
FIG. 12 is a schematic view showing an assembling design of the first embodiment of present invention inside a laptop computer.

FIG. 12 illustrates a schematic view showing an assembling design of the present invention inside a laptop computer with cross flow type blower.

While various embodiments have been shown, it should also be obvious to those having ordinary skill in the art that there are still further variations in the number of parts of the electric drives, magnetized disks and other features of the invention which while not disclose, are encompassed within the spirit of the invention.

What is claimed is:

1. An integrated cooler for electronic devices comprising:
   (i) at least one heat exchange element, at least one heat transferring element and a blower with an electric drive, wherein;
   (ii) said heat exchange element comprising a base and heat exchanging means;
   (iii) said electronic device being directly thermally connected with said base or said heat exchanging means by said heat transferring element;
   (iv) said blower comprising an inlet, an outlet, at least one guide vane and a drum type impeller comprising at least one disk with blades mounted on an axle fixed perpendicularly to said base;
   (vi) said electric drive comprising a rotor and at least one stator, wherein said rotor being integrated with said impeller having circumferential arrayed magnetic means magnetized in the direction parallel to said axle;
   (vii) said stator comprising circumferential arrayed coils spaced axially from said magnetic means;
   (viii) said impeller further comprising an inner space surrounded by said blades and said magnetic means in plain view, said guide vane being located at said inner space;
   (ix) said heat exchanging means being located at said inlet and/or at said outlet, thus ambient air flows through said inlet, said blades, said guide vane, said blades again and said outlet in a series way and in the directions perpendicular to said axle, so that said blower being a crossflow type blower.

2. The cooler as claimed in claim 1, wherein said electronic device being directly thermally connected with said base by said heat transferring element.

3. The cooler as claimed in claim 2, wherein said heat exchanging means are pins or fins made on a surface of said base.

4. The cooler as claimed in claim 2, wherein said heat exchanging means are pins and fins made on a surface of said base.

5. The cooler as claimed in claim 2, wherein said heat transferring element being a surface of said electronic device.

6. The cooler as claimed in claim 1, wherein said heat transferring element being made from a high heat-conducting material.

7. The cooler as claimed in claim 1, wherein said heat transferring element being a heat-pipe.

8. The cooler as claimed in claim 2, wherein said heat exchanging means being arranged as rows of profiled elements and said rows together with the inner surfaces of said inlet and said outlet form heat exchanging channels.

9. The cooler as claimed in claim 8, wherein said heat exchanging channels being made spiral-like and bent in the direction of impeller rotation.

10. The cooler as claimed in claim 8, wherein inlets of said heat exchanging channels located at said outlet being oriented in the output direction of the ambient airflow produced by said impeller.

11. The cooler as claimed in claim 8, wherein said heat exchanging channels being made of constant width.

12. The cooler as claimed in claim 1, wherein said magnetic means being at least part of said blades.

13. The cooler as claimed in claim 1, wherein said magnetic means being at least part of each said blade.

14. The cooler as claimed in claim 1, wherein said rotor comprising at least one magnetized disk serves as said magnetic means and being placed flush-mounted with said disk.

15. The cooler as claimed in claim 2, comprising two said heat exchange elements and two said stators, wherein said at least one heat transferring element being located between two said heat exchange elements connected together by each of said base and said heat exchanging means of each said heat exchange element covered by each of said stator and wherein said impeller being located between two said stators.

16. The cooler as claimed in claim 14, wherein said rotor comprising two said magnetized disks mounted on said axle and having a circumferential array of radially extending magnetized poles, said magnetized poles of one said magnetized disk being spaced axially from said magnetized poles of other said magnetized disk to form a gap where said stator being located, and said magnetized poles of one said magnetized disk being magnetically opposite to said magnetized poles of other said magnetized disk, such that the flux lines of N poles of one said magnetized disk extends to S poles of other said magnetized disk in the shortest axial flux dimension across said gap.

17. The cooler as claimed in claim 16, wherein said rotor further comprising cylindrical or polygonal magnets placed coaxially to said axle between said adjacent magnetized disks.

18. The cooler as claimed in claim 16, wherein said impeller comprising two disks, wherein each said disk from one side attached with said blades, while other side attached with each said flush-mounted magnetized disk.

19. The cooler as claimed in claim 1, wherein said coils etched on circuit board metal layers and numbers of said coils is divisible in respect to numbers of said magnetic means, said coils being spaced axially from said magnetic means of said impeller.

20. The cooler as claimed in claim 19, wherein said coils are plated with ferromagnetic coating material.

21. The cooler as claimed in claim 20, wherein said ferromagnetic coating material is nickel.

22. The cooler as claimed in claim 19, wherein said circuit board metal layers are copper layers.

23. The cooler as claimed in claim 19, wherein said stator further comprising a controlling device of a type H-bridge drive, and a single layer of coils located on each side of said circuit board, where each said layer comprising several pairs of coils and each pair being made as a spiral that extends from the center of a start coil to a center of an end coil with the same turn direction of said spiral in relation to each coils center; said layers of coils are the same in transparent view and shifted angularly in such a way that said center of said start coils from one side of said board being electrically connected through said circuit board by internal via's, which are copper plated holes, with said center of said end coils on the other side of said board; said circuit of said one layer of coils being interrupted for providing power leads to said controlling device.

24. The cooler as claimed in claim 1, wherein said electronic device being directly thermally connected with said heat exchanging means by said heat transferring element.

25. The cooler as claimed in claim 24, wherein said heat exchanging means are fins and said heat transferring element is a heat-pipe, thus said fins being located at said inlet and fixed around and directly thermally connected with said heat-pipe.

* * * * *